(12) United States Patent
Shang et al.

(10) Patent No.: US 8,548,773 B2
(45) Date of Patent: Oct. 1, 2013

(54) HIGH SPEED CHIP SCREENING METHOD USING DELAY LOCKED LOOP

(75) Inventors: Junqiang Shang, Shanghai (CN); Liang Zhang, Shanghai (CN); Yong Wang, Shanghai (CN); Xin Liu, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 688 days.

(21) Appl. No.: 12/607,576

(22) Filed: Oct. 28, 2009

(65) Prior Publication Data

US 2011/0098977 A1    Apr. 28, 2011

(51) Int. Cl.
*G06F 11/30* (2006.01)
*H03L 7/06* (2006.01)

(52) U.S. Cl.
USPC ................................ 702/186; 327/158

(58) Field of Classification Search
USPC ............... 702/186, 57, 65–67, 69, 71–72, 79, 702/81, 84–85, 106–108, 117, 120, 125, 702/127, 176, 182–183, 189; 327/2–3, 5, 327/39–40, 42, 44–48, 72–74, 77, 102, 145–149, 327/153–158, 161–163, 291, 299; 375/362, 375/371–376; 713/500–503
See application file for complete search history.

(56) References Cited

U.S. PATENT DOCUMENTS
7,239,188 B1 *   7/2007   Xu et al. .................. 327/156

OTHER PUBLICATIONS

Cheng et al., A Mixed-Mode Delay-Locked Loop for Wide-Range Operation and Multiphase Clock Generation, 2003, Proceedings of the 3rd IEEE International Workshop on System-on-Chip for Real-Time Applications, 4 pp.*
Liu et al., Low-Power Clock-Deskew Buffer for High-Speed Digital Circuits, Apr. 1999, IEEE Journal of Solid-State Circuits, vol. 34, No. 4, pp. 554-558.*
Cheng et al., A Fast-Lock Mixed-Mode DLL with Wide-Range Operation and Multiphase Outputs, 2006 EDAA, pp. 178-182.*
Provost et al., AC IO Loopback Design for High Speed uProcessor IO Test, 2004 IEEE, ITC International Test Conference, pp. 23-30.*

* cited by examiner

*Primary Examiner* — Toan Le
(74) *Attorney, Agent, or Firm* — Panitch, Schwarze, et al.

(57) ABSTRACT

A voltage controlled delay line (VCDL) for measuring the maximum speed of a chip includes a first input configured to receive a reference clock signal, a first output configured to output an output clock signal, and a second input configured to receive a phase error signal representing a phase delay between the reference and output clock signals. A register stores a delay code applied by the VCDL to the reference clock signal to delay the reference clock signal to generate the output clock signal. The delay code is adjusted according to the phase error signal until the phase delay is equal to a predetermined value. A second output is coupled to an interface that reads the delay code from the register and outputs the delay code to automated testing equipment when the phase delay is equal to the predetermined value. The outputted delay code corresponds to the maximum chip speed.

14 Claims, 3 Drawing Sheets

HIGH SPEED CHIP SCREENING METHOD USING DELAY LOCKED LOOP

BACKGROUND OF THE INVENTION

The present invention relates generally to an apparatus for screening high speed chips during mass production, and more particularly, to high speed chip screening via an algorithm in an embedded delay lock loop (DLL) that is read from a register through an interface by automated testing equipment (ATE).

High speed chips, such as a serializer/deserializer (serdes), advanced memory buffer (AMB), or the like can achieve speeds reaching several Giga-samples per second (GSa/s). During mass production, it is difficult to monitor the process variation and test the chip speed for compliance. Conventionally, the chip would include a built-in self-test (BIST) loop. By sweeping a reference clock through the BIST loop, the maximum speed of the chip could be determined. However, this procedure suffers from several drawbacks, particularly in the context of speed screening during mass production. For example, screening using the BIST is time-consuming due to the frequency sweeping. Further, the BIST is always a partial test and cannot cover the entire chip, and repeatability is a concern with BIST loops.

Another conventional screening technique includes the provision of a ring oscillator on the chip. The speed of the chip could be determined by measuring the frequency of the ring oscillator at an output, but an oscilloscope is required to perform the frequency measurement. Using an oscilloscope during production testing is very difficult, and often impossible. As a further complication to speed screening, ATE cannot test a high speed signal directly from the chip due to hardware limitations.

It is therefore desirable to provide an apparatus that enables accurate speed screening of high speed chips, reduces test times during mass production, is reliable and repeatable, and does not require the use of unnecessary testing instruments.

BRIEF SUMMARY OF THE INVENTION

Briefly stated, an embodiment of the present invention comprises a voltage controlled delay line (VCDL) for use in an apparatus for measuring the maximum speed of a chip with automated testing equipment. The VCDL includes a first input configured to receive a reference clock signal, a first output configured to output an output clock signal, and a second input configured to receive a phase error signal. The phase error signal represents a phase delay between the reference clock signal and the output clock signal. A register has a delay code stored therein. The VCDL is configured to generate the output clock signal by applying the delay code stored in the register to the reference clock signal to delay the reference clock signal. The delay code is adjusted according to the phase error signal until the phase delay is equal to a predetermined value. A second output is coupled to an interface configured to read the delay code from the register of the VCDL and output the delay code to the automated testing equipment when the phase delay is equal to the predetermined value. The outputted delay code corresponds to the maximum speed of the chip.

Another embodiment of the present invention comprises an apparatus for measuring the maximum speed of a chip with automated testing equipment including a phase detector having a first input configured to receive a reference clock signal, a second input configured to receive an output clock signal, and an output. The phase detector is configured to compare the reference clock signal with the output clock signal to generate at the output of the phase detector a phase error signal representing a phase delay between the reference clock signal and the output clock signal. A voltage controlled delay line (VCDL) includes a first input configured to receive the reference clock signal, a second input coupled to the output of the phase detector and configured to receive the phase error signal, a first output configured to feed back the output clock signal to the second input of the phase detector, a second output, and a register having a delay code stored therein. The VCDL is configured to generate the output clock signal by applying the delay code stored in the register to the reference clock signal to delay the reference clock signal. The delay code is adjusted according to the phase error signal until the phase delay is equal to a predetermined value. An interface is coupled to the second output of the VCDL and is configured to read the delay code from the register of the VCDL and output the delay code to the automated testing equipment when the phase delay is equal to the predetermined value. The outputted delay code corresponds to the maximum speed of the chip.

A further embodiment of the present invention comprises a method of measuring the maximum speed of a chip with automated testing equipment. The method includes receiving a reference clock signal at a voltage controlled delay line (VCDL), generating, by the VCDL, an output clock signal by delaying the reference clock signal according to a delay code stored in a register of the VCDL, and adjusting the delay code according to a phase error signal received by the VCDL. The phase error signal represents a phase delay between the reference clock signal and the output clock signal. The method further includes outputting, by the VCDL and through an interface to the automated testing equipment, the delay code when the phase delay is equal to a predetermined value. The outputted delay code corresponds to the maximum speed of the chip.

BRIEF DESCRIPTION OF THE DRAWINGS

The foregoing summary, as well as the following detailed description of preferred embodiments of the invention, will be better understood when read in conjunction with the appended drawings. For the purpose of illustration, there are shown in the drawings embodiments which are presently preferred. It should be understood, however, that the invention is not limited to the precise arrangements and instrumentalities shown.

DETAILED DESCRIPTION OF THE INVENTION

Certain terminology is used in the following description for convenience only and is not limiting. The words "a" and "an", as used in the claims and in the corresponding portions of the specification, mean "at least one."

Figure 1:
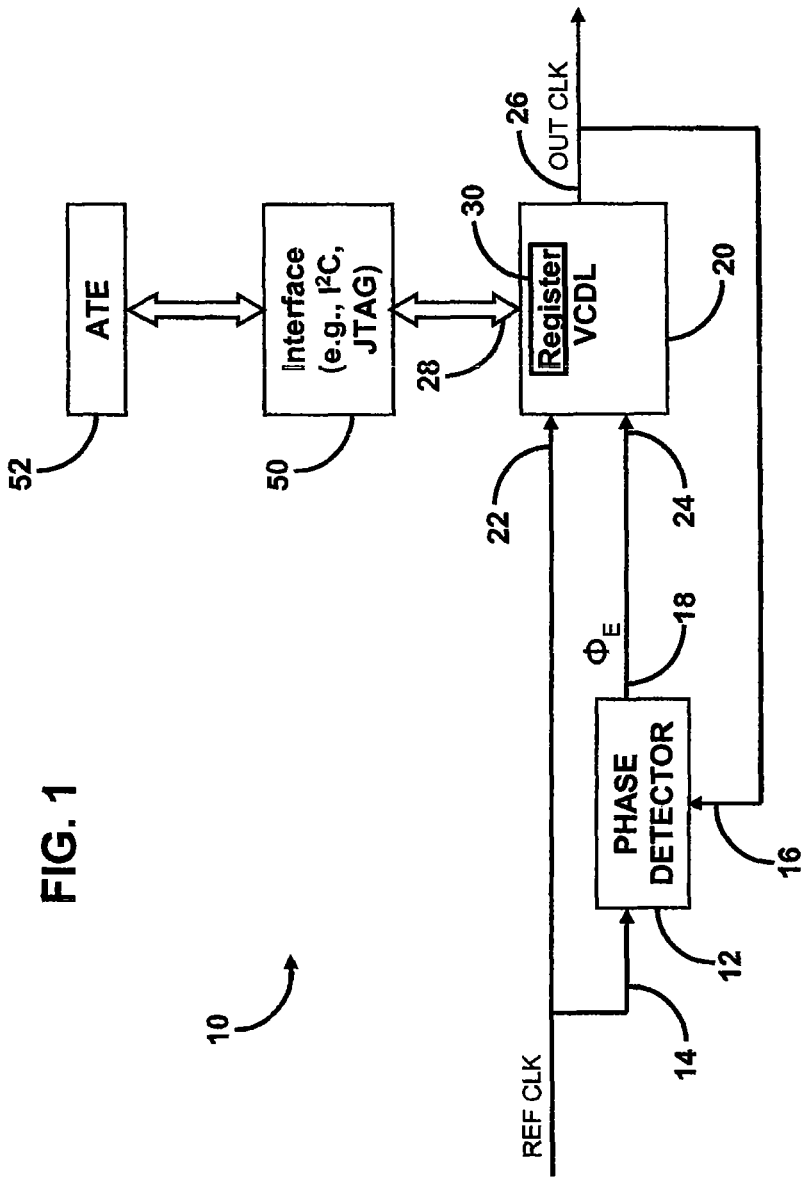
FIG. 1 is a schematic block diagram of a chip speed screening system in accordance with a preferred embodiment of the present invention.

Referring to the drawings in detail, wherein like reference numerals indicate like elements throughout, FIG. 1 shows a preferred embodiment of a system 10 for measuring the maximum speed of a chip. The system 10, which forms an on-chip DLL, includes a phase detector 12 having a first input 14, a second input 16, and an output 18. The first input 14 is configured to receive a reference clock signal REF CLK, which is preferably generated by the circuitry of the chip (not shown). The second input 16 is configured to receive an output clock signal OUT CLK, which will be described in further detail below. The phase detector 12 is configured to compare the reference clock signal REF CLK with the output clock signal OUT CLK to generate a phase error signal ΦE, which is sent to the output 18 of the phase detector 12. The phase error signal $\Phi_E$ is a control signal that represents a phase delay between the reference clock signal REF CLK and the output clock signal OUT CLK.

The system 10 also includes a voltage controlled delay line (VCDL) 20, which includes first and second inputs 22, 24 and first and second outputs 26, 28. Similar to the first input 14 of the phase detector 12, the first input 22 of the VCDL 20 receives the reference clock signal REF CLK. The second input 24 of the VCDL 20 is coupled to the output 18 of the phase detector 12 and is therefore configured to receive the phase error signal $\Phi_E$. The VCDL 20 generates the output clock signal OUT CLK at the first output 26, which is configured to feed back the output clock signal OUT CLK to the second input 16 of the phase detector 20.

The VCDL 20 also includes a register 30, which stores a delay code therein. The VCDL 20 is configured to generate the output clock signal OUT CLK by applying the delay code stored in the register 30 to the reference clock signal REF CLK to delay the reference clock signal REF CLK. The delay code is adjustable according to the phase error signal $\Phi_E$ supplied by the phase detector 12. Once the phase delay between the reference clock signal REF CLK and the output clock signal OUT CLK is equal to a predetermined (desired) value, the delay code is locked. The predetermined value is preferably a phase delay of ninety degrees, but other values may be used.

Figure 2:
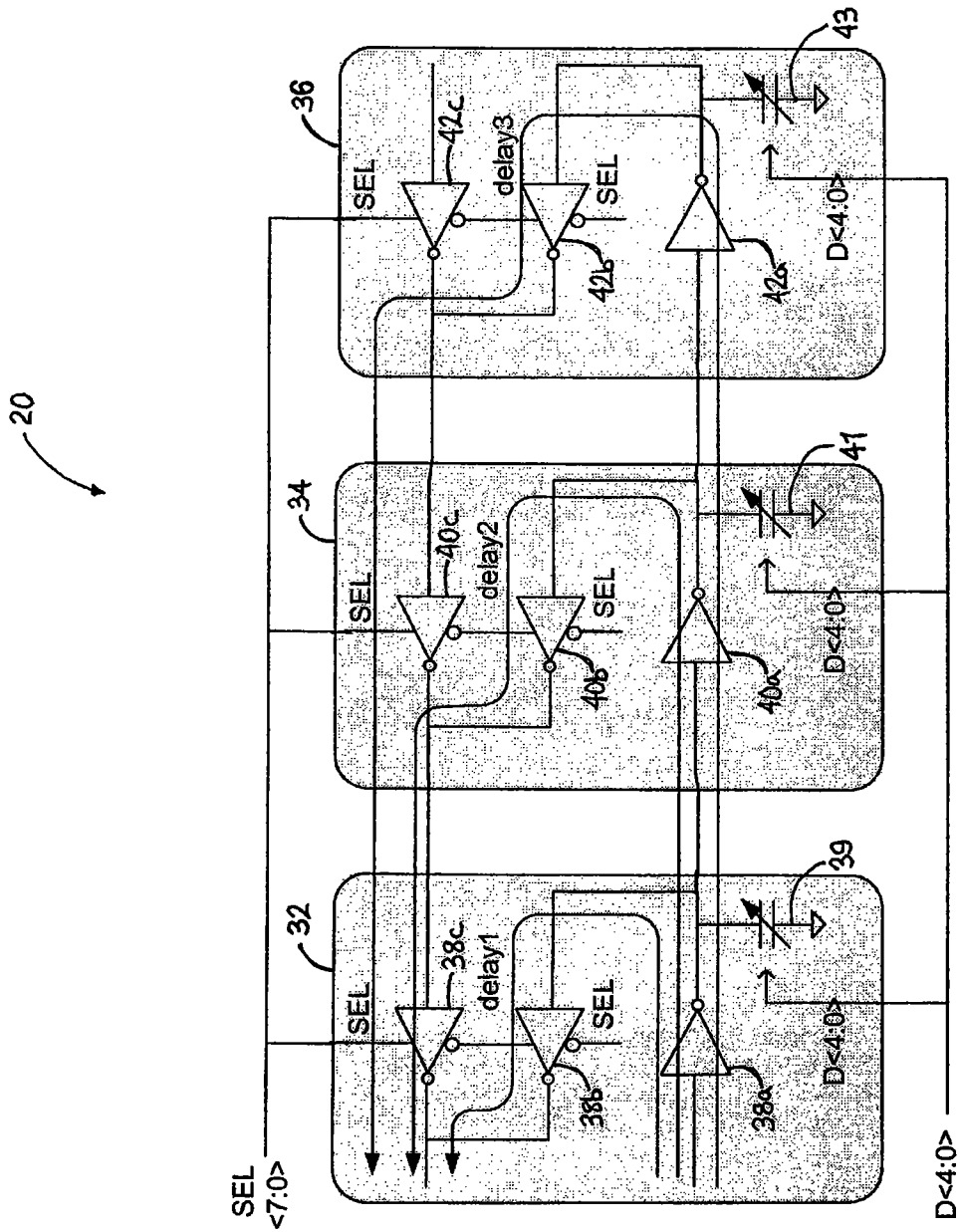
FIG. 2 is a partial schematic of the voltage-controlled delay line of FIG. 1.

The delay code is preferably a first multi-bit control signal and a second multi-bit control signal, which may be applied to at least two delay buffers. FIG. 2 is an exemplary partial schematic of a VCDL 20 having three delay buffers 32, 34, 36. The first delay buffer 32 includes three inverters 38a, 38b, 38c and a variable capacitor 39. The second and third delay buffers 34, 36 are identically arranged. The reference clock signal REF CLK traverses a number of the delay buffers 32, 34, 36 based on the first multi-bit control signal delay code, and the capacitance of the variable capacitors 39, 41, 43 is determined by the second multi-bit control signal of the delay code. Table 1 below shows a potential application of the delay code within the VCDL 20.

TABLE 1

| Step | SEL<7:0> | D<4:0> | Delay | Delta |
|---|---|---|---|---|
| 1 | 11111110 | 00000 | inv*2 | |
| 2 | 11111110 | 00001 | inv*2 + rc*1 | rc*1 |
| 3 | 11111110 | 00011 | inv*2 + rc*2 | rc*1 |
| 4 | 11111110 | 00111 | inv*2 + rc*3 | rc*1 |
| 5 | 11111110 | 01111 | inv*2 + rc*4 | rc*1 |
| 6 | 11111110 | 11111 | inv*2 + rc*5 | rc*1 |
| 7 | 11111101 | 00000 | inv*4 + rc*5 | inv*2 |
| 8 | 11111101 | 00001 | inv*4 + rc*6 | rc*1 |
| 9 | 11111101 | 00011 | inv*4 + rc*7 | rc*1 |
| 10 | 11111101 | 00111 | inv*4 + rc*8 | rc*1 |
| 11 | 11111101 | 01111 | inv*4 + rc*9 | rc*1 |
| 12 | 11111101 | 11111 | inv*4 + rc*10 | rc*1 |
| 13 | 11111011 | 00000 | inv*6 + rc*10 | inv*2 |
| 14 | 11111011 | 00001 | inv*6 + rc*11 | rc*1 |
| 15 | 11111011 | 00011 | inv*6 + rc*12 | rc*1 |

According to the example of Table 1, the first multi-bit control signal SEL is an eight bit signal and the second multi-bit control signal D is a five bit signal. In Step 1, the first control signal SEL has an exemplary value of 11111110, causing the reference clock signal REF CLK to traverse the first buffer 32 only (delay1 path in FIG. 2 traversing inverters 38a, 38b). The second control signal D has an exemplary value of 00000, setting the variable capacitor 39 to the lowest setting. Thus, the delay experienced by the reference clock signal REF CLK is equivalent to the delay caused by the traversal of two inverters 38a, 38b.

In step 2, the first control signal SEL remains the same, but the second control signal D is adjusted to an exemplary value of 00001, thereby increasing the delay from step 1 by an additional value rc introduced by the variable capacitor 39. As further steps are required, D is adjusted by an additional amount rc until the variable capacitor 39 reaches its maximum. By step 7, the first control signal SEL is adjusted to an exemplary value of 11111101, causing the reference clock to now traverse the first and second delay buffers 32, 34 (delay2 path in FIG. 2 traversing inverters 38a, 40a, 40b, 38c). The second control signal D supplied to the variable capacitor 41 of the second delay buffer 34 begins at the exemplary value of 00000, and the process of stepping the variable capacitance is repeated. At step 13, the first control signal SEL is 11111011, causing the reference clock signal REF CLK to traverse all three delay buffers 32, 34, 36 (delay3 path traversing inverters 38a, 40a, 42a, 42b, 40c, 38c). As can be seen from the above description, the VCDL 20 adjusts between steps based on the received phase error signal $\Phi_E$ in order to lock into the desired phase delay of the reference clock signal REF CLK. Adjustments may be made by stepping incrementally or decrementally (i.e. step 1 to step 2), but preferably adjustments are made by altering the delay code to the desired step, thereby shortening the time period for achieving phase lock.

Referring again to FIG. 1, the second output 28 of the VCDL 20 is coupled to an interface 50. The interface 50 is configured to access the register 30 to read out the delay code when the phase delay is equal to the desired value. Preferably, the interface 50 is one of an inter-integrated circuit ($I^2C$) interface, a Joint Test Action Group (JTAG) interface, and a System Packet Interface (SPI). The interface 50 outputs the delay code to ATE 52 having a similar interface (not shown).

The outputted delay code corresponds to the maximum speed of the chip. In Table 1, for example, a higher step required for lock indicates a faster chip. The correlation between the delay code and the actual chip speed can be determined through bench testing. Once the correlation between each step is made to a particular chip speed, the ATE 52 can be programmed to automatically present the chip speed to the user upon mass production tests. The resolution of the testing may be increased by the addition of more delay buffers. The system 10 thus exhibits repeatability and high precision speed grading, reduces test time, and may easily be ported to other processes.

Figure 3:
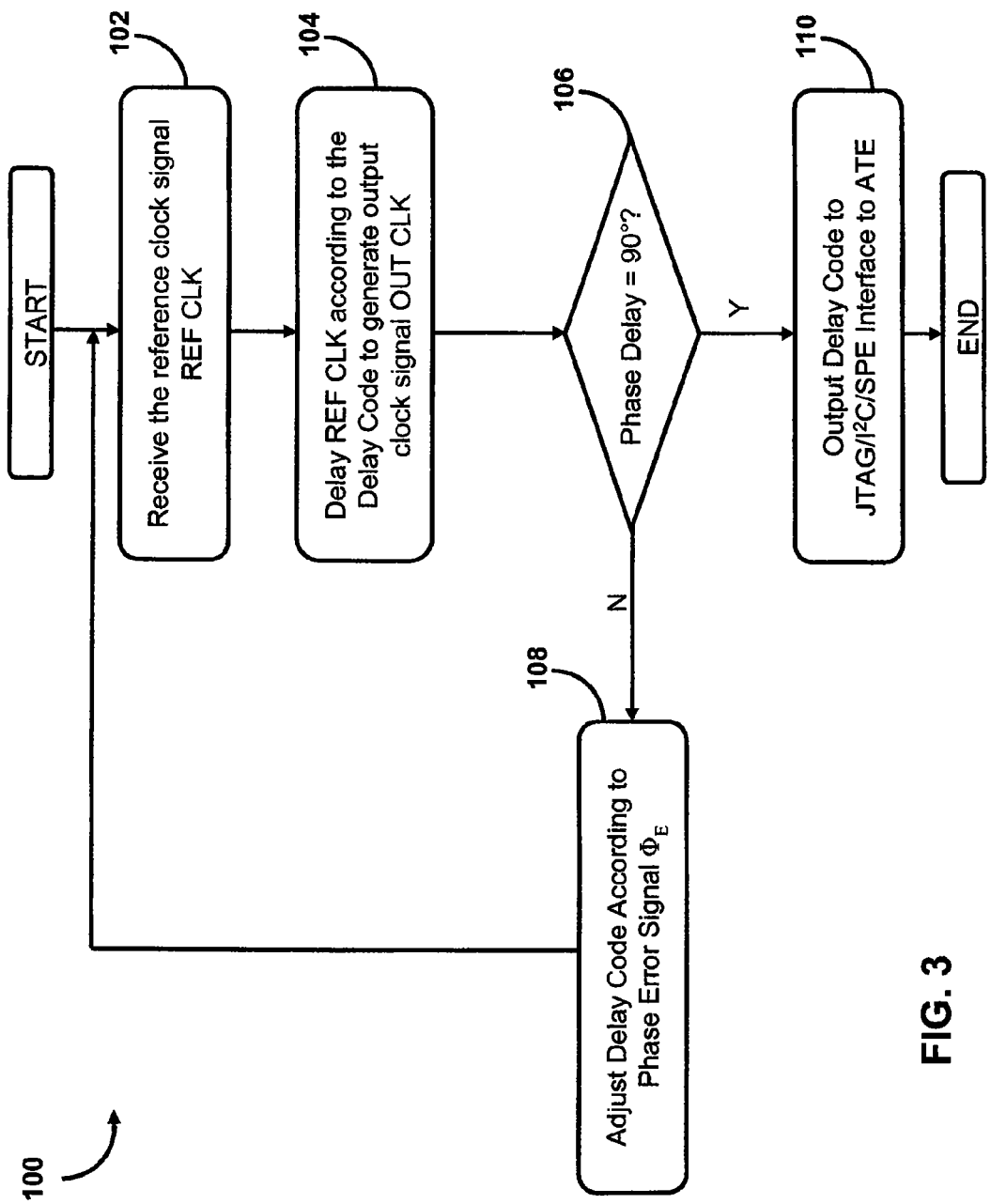
FIG. 3 is an exemplary flow chart of the operation of the voltage controlled delay line of FIG. 1.

FIG. 3 is thus a flowchart 100 of a preferred embodiment of operation of the VCDL 20. The VCDL 20 receives the reference clock signal REF CLK at step 102 and delays the reference clock signal REF CLK according to the delay code in the register 30 in order to generate the output clock signal OUT CLK at step 104. If the phase delay is not equal to the predetermined value (for example, 90°) at step 106, the delay code is adjusted in the register 30 according to the phase error signal $\Phi_E$ at step 108, wherein steps 102-106 are thereafter repeated. Once the phase delay is equal to 90°, the delay code may be output from the register 30 to the interface 50.

It will be appreciated by those skilled in the art that changes could be made to the embodiments described above without departing from the broad inventive concept thereof. It is understood, therefore, that the invention is not limited to the particular embodiments disclosed, but it is intended to cover modifications within the spirit and scope of the present invention as defined by the appended claims.

We claim:

1. A voltage controlled delay line (VCDL) for use in an apparatus for measuring the maximum speed of a chip with automated testing equipment comprising:
    (a) a first input configured to receive a reference clock signal;
    (b) a first output configured to output an output clock signal;
    (c) a second input configured to receive a phase error signal, the phase error signal representing a phase delay between the reference clock signal and the output clock signal;
    (d) a register having a delay code stored therein, the VCDL being configured to generate the output clock signal by applying the delay code stored in the register to the reference clock signal to delay the reference clock signal, the delay code being adjusted according to the phase error signal until the phase delay is equal to a predetermined value; and
    (e) a second output coupled to an interface configured to read the delay code from the register of the VCDL and output the delay code to the automated testing equipment when the phase delay is equal to the predetermined value, the outputted delay code corresponding to the maximum speed of the chip.

2. The VCDL of claim 1, wherein the delay code is a first multi-bit control signal and a second multi-bit control signal.

3. The VCDL of claim 2, wherein the VCDL includes at least two delay buffers.

4. The VCDL of claim 3, wherein each of the delay buffers includes a plurality of inverters and a variable capacitor.

5. The VCDL of claim 4, wherein the first multi-bit control signal determines a number of delay buffers traversed by the reference clock signal.

6. The VCDL of claim 4, wherein the second multi-bit control signal determines a capacitance of the variable capacitor.

7. The VCDL of claim 2, wherein the first multi-bit control signal is an eight bit signal and the second multi-bit control signal is a five bit signal.

8. The VCDL of claim 1, wherein the interface is one of an inter-integrated circuit (I²C) interface, a Joint Test Action Group (JTAG) interface, and a System Packet Interface (SPI).

9. The VCDL of claim 1, wherein the predetermined value is ninety degrees.

10. An apparatus for measuring the maximum speed of a chip with automated testing equipment comprising:
    (a) a phase detector having:
        a first input configured to receive a reference clock signal,
        (ii) a second input configured to receive an output clock signal, and
        (iii) an output,
    the phase detector being configured to compare the reference clock signal with the output clock signal to generate at the output of the phase detector a phase error signal representing a phase delay between the reference clock signal and the output clock signal;
    (b) a voltage controlled delay line (VCDL) having:
        (i) a first input configured to receive the reference clock signal,
        (ii) a second input coupled to the output of the phase detector and configured to receive the phase error signal,
        (iii) a first output configured to feed back the output clock signal to the second input of the phase detector,
        (iv) a second output, and
        (v) a register having a delay code stored therein,
    the VCDL being configured to generate the output clock signal by applying the delay code stored in the register to the reference clock signal to delay the reference clock signal, the delay code being adjusted according to the phase error signal until the phase delay is equal to a predetermined value; and
    (c) an interface coupled to the second output of the VCDL and configured to read the delay code from the register of the VCDL and output the delay code to the automated testing equipment when the phase delay is equal to the predetermined value, the outputted delay code corresponding to the maximum speed of the chip.

11. A method of measuring the maximum speed of a chip with automated testing equipment, the method comprising:
    (a) receiving a reference clock signal at a voltage controlled delay line (VCDL);
    (b) generating, by the VCDL, an output clock signal by delaying the reference clock signal according to a delay code stored in a register of the VCDL;
    (c) adjusting the delay code according to a phase error signal received by the VCDL, the phase error signal representing a phase delay between the reference clock signal and the output clock signal; and
    (d) outputting, by the VCDL and through an interface to the automated testing equipment, the delay code when the phase delay is equal to a predetermined value, the outputted delay code corresponding to the maximum speed of the chip.

12. The method of claim 11, wherein the step of adjusting the delay code includes adjusting the value of at least one of a first multi-bit control signal and a second multi-bit control signal.

13. The method of claim 12, wherein the VCDL includes a plurality of delay buffers, and step (b) includes passing the reference clock signal through a predetermined number of the delay buffers according to the value of the first multi-bit control signal.

14. The method of claim 12, wherein the VCDL includes at least one variable capacitor, and step (b) includes applying a predetermined capacitance to the reference clock signal according to the value of the second multi-bit control signal.

\* \* \* \* \*